United States Patent
Bruce et al.

(10) Patent No.: US 6,529,029 B1
(45) Date of Patent: Mar. 4, 2003

(54) MAGNETIC RESONANCE IMAGING OF SEMICONDUCTOR DEVICES

(75) Inventors: Michael R. Bruce; Jeffrey D. Birdsley; Rosalinda M. Ring; Rama R. Goruganthu; Brennan V. Davis, all of Austin, TX (US)

(73) Assignee: Advanced Micro Devices, Inc, Sunnyvale, CA (US)

( * ) Notice: Subject to any disclaimer, the term of this patent is extended or adjusted under 35 U.S.C. 154(b) by 0 days.

(21) Appl. No.: 09/409,973

(22) Filed: Sep. 30, 1999

(51) Int. Cl.[7] .............................................. G01R 31/28
(52) U.S. Cl. ........................................ 324/765; 324/750
(58) Field of Search ................................ 324/319, 765, 324/750, 213, 753; 438/14–18

(56) References Cited

U.S. PATENT DOCUMENTS

| | | | |
|---|---|---|---|
| 4,982,158 A | 1/1991 | Nakata et al. ............... | 324/263 |
| 5,384,536 A | 1/1995 | Murakami et al. ........... | 324/309 |
| 5,408,178 A | 4/1995 | Wikswo, Jr. et al. ........ | 324/201 |
| 5,751,243 A | 5/1998 | Turpin ......................... | 342/179 |
| 6,069,366 A * | 5/2000 | Goruganthu et al. ... | 250/559.27 |
| 6,107,107 A * | 8/2000 | Bruce et al. .................. | 438/14 |
| 6,169,408 B1 * | 1/2001 | Kantor et al. ................ | 324/752 |

* cited by examiner

*Primary Examiner*—Safet Metjahic
*Assistant Examiner*—Vincent Q. Nguyen

(57) ABSTRACT

A method for detecting substrate damage in a flip chip die, having a back side and a circuit side, that uses magnetic resonance imaging. The back side of the die is first globally thinned down and a region for examination is selected. A magnetic field is applied to the selected region and then the region is scanned with a magnetic resonance imaging arrangement. A plurality of perturbations are measured to generate an array of perturbation signals, which are then converted to a local susceptibility map of the selected region of the die. The susceptibility map of the selected region is then examined to determine if there is any substrate damage.

20 Claims, 3 Drawing Sheets

MAGNETIC RESONANCE IMAGING OF SEMICONDUCTOR DEVICES

FIELD OF THE INVENTION

The present invention relates generally to semiconductor devices and their fabrication and, more particularly, to semiconductor devices and their manufacture involving techniques for analyzing and debugging circuitry within an integrated circuit.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

To increase the number of pad sites available for a die, to reduce the electrical path to the pad sites, and to address other problems, various chip packaging techniques have been developed. One of these techniques is referred to as controlled collapse chip connection or "flip-chip" packaging. With packaging technology, bonding pads of the die include metal (solder) bumps. Electrical connection to the package is made when the die is "flipped" over and soldered to the package. Each bump connects to a corresponding package inner lead. The resulting packages are low profile and have low electrical resistance and a short electrical path. The output terminals of the package, which are sometimes ball-shaped conductive bump contacts, are typically disposed in a rectangular array. These packages are occasionally referred to as "Ball Grid Array" (BGA) packages. Alternatively, the output terminals of the package may be pins and such packages are commonly known as pin grid array (PGA) packages.

Once the die is attached to such a package the back side portion of the die remains exposed. The transistors and other circuitry are generally formed in a very thin epitaxially-grown silicon layer on a single crystal silicon wafer from which the die is singulated. The side of the die including the epitaxial layer containing the transistors and other circuitry is often referred to as the circuit side or front side of the die. The circuit side of the die is positioned very near the package and opposes the back side of the die. Between the back side and the circuit side of the die is bulk silicon.

The positioning of the circuit side near the package provides many of the advantages of the flip chip. However, in some instances orienting the die with the circuit side face down on a substrate is disadvantageous. Due to this orientation of the die, the transistors and circuitry near the circuit side are not directly accessible for testing, modification or other purposes. Therefore, access to the transistors and circuitry near the circuit side is from the back side of the chip.

Techniques have been developed to access the circuit even though the integrated circuit (IC) is buried under the bulk silicon. For example, near infrared (nIR) microscopy is capable of imaging the circuit because silicon is relatively transparent in these wavelengths of the radiation. However, because of the absorption losses of nIR radiation in silicon, it is generally required to thin the die to less than 100 microns in order to view the circuit using nIR microscopy. For a die that is 725 microns thick, at least 625 microns of silicon is removed before nIR microscopy can be used.

Thinning the die for analysis of a flip chip bonded IC is usually accomplished by first globally thinning, wherein the silicon is thinned across the entire die surface. The silicon is globally thinned to allow viewing of the active circuit from the back side of the die using nIR microscopy. Mechanical polishing and chemical-mechanical polishing are two example methods for global thinning. Using nIR microscopy, an area is identified for accessing a particular area of the circuit.

Once an area is identified as an area of interest and it is determined that access is needed to a particular area of the circuit, local thinning techniques can be used to thin an area smaller than the die size. One method of local thinning, referred to as Laser microchemical etching, is typically accomplished by focussing a laser beam on the back side of the silicon surface to cause local melting of silicon in the presence of chlorine gas. The molten silicon reacts very rapidly with chlorine and forms silicon tetrachloride gas, which leaves the molten (reaction) zone.

During failure analysis or for design debug of a flip chip die, accessing circuitry generally involves removing substrate from the back side of the die to access a node, or milling to the node and subsequently depositing a metal on the node. Often, global and local thinning processes as described above are used to accomplish such substrate removal. Accurate control of the substrate removal process, however, is not readily achieved. The global and local thinning processes described above often involve abrasive or otherwise damaging methods. When not controlled properly, removing substrate from the back side of a flip chip die can result in damage to or destruction of circuitry and other substrate in the device. In addition, as the substrate is thinned the amount of substrate remaining over circuitry in the device decreases, increasing the possibility for damage and making the proper control of the substrate removal process even more important.

Thinning of the back side of the die for accessing circuitry, though desirable, also involves certain part tolerances that must be addressed. One tolerance issue involves keeping the height of solder ball contacts on the die substantially uniform for every packaged device of a particular type. Even though the solder ball contacts have a tolerance requirement, when the solder is reflowed to attach the die to a package, the amount of change in height due to solder reflow can vary by several microns. The thickness of the die between the circuit side and back side is also subject to tolerance differences. Since the thickness of the starting silicon wafer is a non-essential parameter for making a functioning die, typically the die thickness is not known to an accurate level.

For instance, a typical die for a microprocessor may have a die thickness of 725±15 microns. The end result is tolerance stacking due to the tolerances for the size of the solder balls, the height at which the die is attached and the thickness of the die. These tolerances stack up such that there can be tens of microns of difference in height from the top surface of the package to the top surface of the die among different packaged devices. Although this does not sound like much of a tolerance problem, it should be noted that the epitaxial layer is only between 2 and 10 microns thick. As a result, the thickness of the remaining silicon of a trench cannot be gauged by measuring from the top surface of the package to the bottom of the trench. Stack up of the tolerances of the various parts precludes simply "measuring up" from the package to which the die is attached to determine where the epitaxial layer containing the transistors begins. Simply put, such an approach is not accurate enough to prevent ruining the circuitry or transistors that must be analyzed or debugged. Once the circuitry or transistors are ruined, analysis or debugging is impossible.

Therefore, flip chip technology would benefit from a method and apparatus for conducting non-destructive testing and analysis of a portion of the active circuitry near the back side of the die that would eliminate the need for local thinning. By eliminating local thinning, failure analysis and debugging of the circuitry is facilitated without risking damage to the internal circuitry to be analyzed.

SUMMARY OF THE INVENTION

The method and system described herein is directed to determining a degree of substrate damage in an integrated circuit die. In an example embodiment there is described a method for detecting substrate damage in an integrated circuit die, having a back side and a circuit side, using magnetic resonance imaging. The back side of the die is first globally thinned down and a region for examination is selected. A magnetic field is applied to the selected region and then the region is scanned with a magnetic resonance imaging arrangement. A plurality of perturbations are measured to generate an array of perturbation signals, which are then converted to a local susceptibility map of the selected region of the die. The susceptibility map of the selected region is then examined to determine if there is any substrate damage.

Another example embodiment is directed to a system for detecting substrate damage in an integrated circuit die using a magnetic field detector arrangement. The system includes a mechanism for thinning the back side of the die and selecting a region for examination. In addition, an irradiation coil for irradiating a radio frequency magnetic field on the die to be examined is included as well as a detection coil disposed in the vicinity of the die, for detecting perturbations in the magnetic field from the die. The system includes a processor arrangement constructed to receive perturbations from the detection coil, convert the perturbations to perturbation signals and then digitize the signals. Finally, the system includes a computer arrangement that is programmed to process the digitized perturbation signals via a susceptibility algorithm, produce a susceptibility map and examine the susceptibility map for substrate damage.

The above summary is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description in connection with the accompanying drawings, in which.

Figure 1:
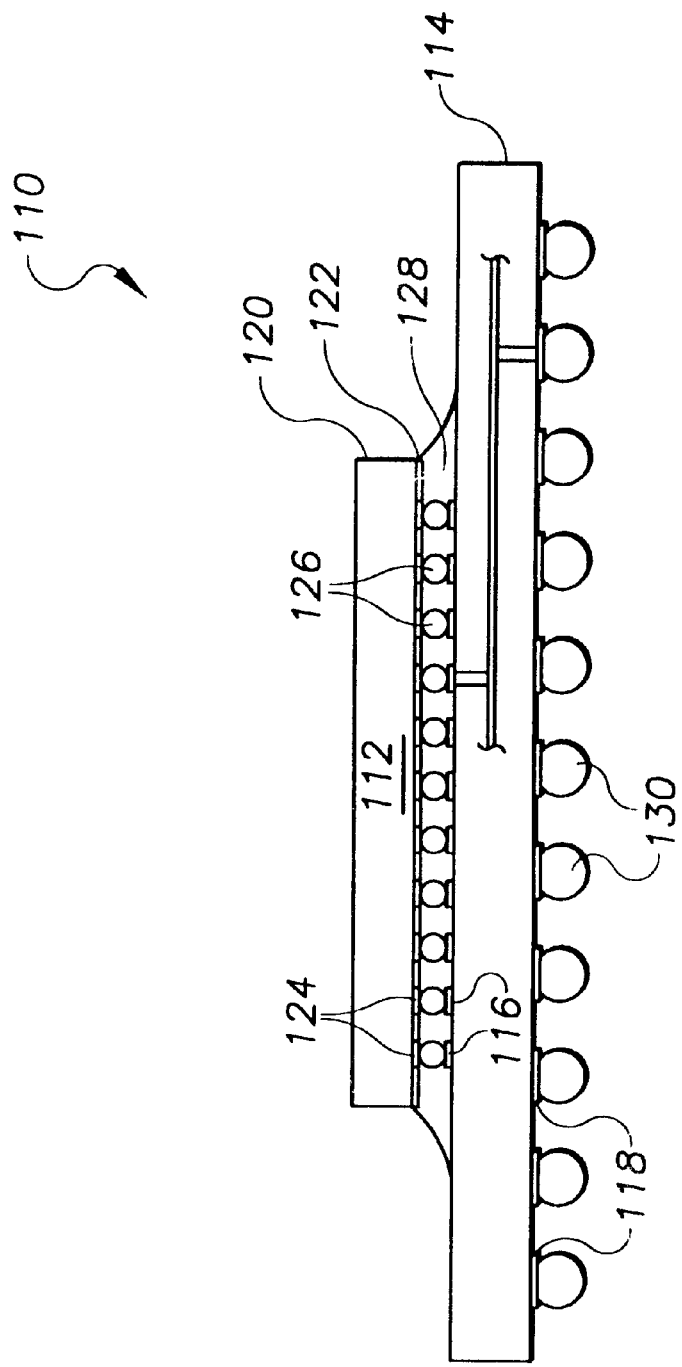
FIG. 1 shows a side view of a conventional integrated circuit packaged as a flip chip, consistent with the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the invention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for flip-chip type circuit packages. While the present invention is not necessarily limited to flip-chip type circuit packages, an appreciation of various aspects of the invention is best gained through a discussion of various examples using such an application.

According to an example embodiment there is described a method for detecting substrate damage in an integrated circuit die, having a back side and a circuit side, using magnetic resonance imaging (MRI). The back side of the die is first globally thinned down and a region for examination is selected. A magnetic field is applied to the selected region and then the region is scanned with a magnetic resonance imaging arrangement. A plurality of perturbations are measured to generate an array of perturbation signals, which are then converted to a local susceptibility map of the selected region of the die. The susceptibility map of the selected region is then examined to determine if there is any substrate damage. In example applications, the substrate may include silicon, alloy material, devices, and circuitry in the die.

As an example semiconductor device target for the present invention, FIG. 1 shows a side view 110 of a type of conventional flip-chip type die 112 assembled to a package substrate 114. Flip chip die 112 has a back side 120 and a circuit side in a portion of the die known as the epitaxial layer 122. The epitaxial layer 122 includes a number of circuit devices and has a thickness in the range of about one to fifteen microns. Bulk silicon fills the back side 120 and is referred to as the bulk silicon layer. A plurality of solder bumps 126 are made on the circuit side at pads 124. The solder bumps 126 are the inputs and outputs to the circuitry associated with the flip chip type die 112. The flip chip type die 112 is attached to the package substrate 114 via the solder bumps on the die 112. The package substrate 114 includes pads 116 that are arranged to correspond to the pattern of solder bumps 126 on the die 112. The region between the die 112 and package substrate 114 is filled with an under-fill material 128 that encapsulates the solder bump connections and provides additional mechanical benefits. The pads 116 are coupled via circuitry to pads 118 on the package substrate, and solder bumps 130 are formed on the pads 118. The solder bumps 130 are the inputs and outputs to the circuitry associated with the package substrate 114.

According to the present invention, a method for using MRI for failure analysis and testing of an integrated circuit involves first applying an intense magnetic field to the thinned backside of a device (such as device 112) to align the nuclei in the area of interest. Pulses of RF energy are then applied to disturb this orientation. Energy released by relaxation of the nuclei between pulses is detected and then processed to produce the image. Through control of the frequency of the RF energy and the magnetic field, resonance can be induced at a desired location within the subject, and thus images along a selected plane through the subject can be generated. Magnetometers are then used to measure the subject-induced perturbations in an intense magnetic field that is produced by the subject. Imaging of the subject is achieved by mapping local magnetic susceptibility in the subject.

The magnetic susceptibility of a material is defined as the ratio of the magnetization density to the intensity of the magnetizing field and thus may be expressed by the relation: X=M/H, where X is magnetic susceptibility, M is the magnetization density and H is the magnetic field intensity. The magnetization of the material has an effect on the magnetic field which may be written as: $B=\mu_0(H+M)$, where B is the field and $\mu_0$ is the permeability of free space. As can be seen, the field B is the sum of the applied field H plus the field contributed by magnetization M of the material that is produced by the applied field. Measurements of perturbations to an applied magnetic field across an object or a selected portion of the object are used to calculate the local susceptibility in the object. A map of the local susceptibility represents an image of the structure of the object and thus can be used different layers within a semiconductor chip. In imaging the local susceptibility across an object, the local perturbations measurements are converted to a local susceptibility. For further discussion on the calculations used to arrive at two and three dimensional susceptibility tomography, reference is made to U.S. Pat. No. 5,408,178, issued Apr. 18, 1995 to Wikswo et al., which is herein incorporated by reference. Reference may also be made to U.S. Pat. No. 5,751,243 issued May 12, 1998 to Turpin and to U.S. Pat. No. 5,384,536 issued Jan. 24, 1995 to Murakami et al., for more information on the use of MRI as an inspection tool.

The susceptibility of the various metals and insulators used in fabrication of silicon-based integrated circuits has a sufficiently high range of values to provide adequate contrast for susceptibility imaging of such devices. The following susceptibilities (10 exp-6 SI) are relevant in the semiconductor area: Al: +21; $Al_2O_3$: –18; Au: –34.5; Cu: –10; Ga: –23; Ge: –71; Si: –4; $SiO_2$: –14; Ti: +151; Pt: +193; and W: +80. For mapping the surface of a three-dimensional object, such as for locating and quantifying surface defects, the sensitivity volume of the magnetometer can be adjusted such as through selection of known designs for gradient pick up coil arrangements and/or through shaping of the field.

Figure 2A:
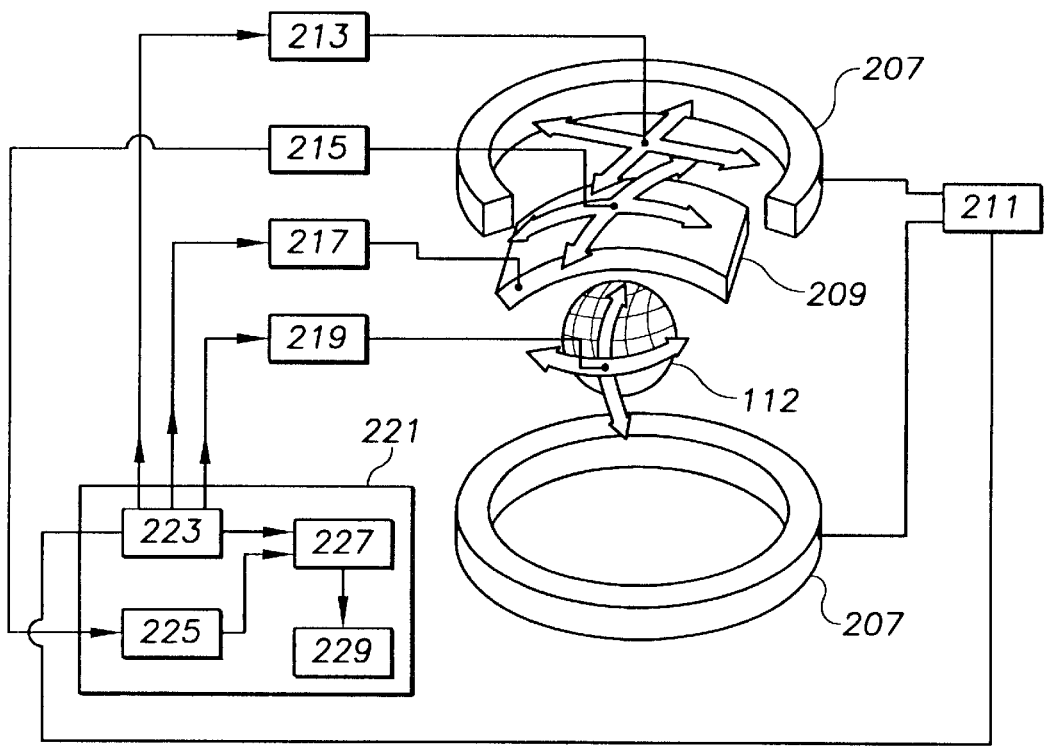
FIGS. 2A and 2B show respective isometric and side views of an arrangement for analyzing an integrated circuit, according to an example embodiment of the present invention.

FIG. 2A illustrates an example system for implementing an aspect of the present invention. A semiconductor object, such as flip chip 112, is placed between the coils of a Helmholtz coil pair 207 that applies a substantially uniform magnetic field to object 112. The field strength is between $10^{-4}$ and $10^{2T}$. Perturbations to the magnetic field attributable to the susceptibility in various parts of the object are measured by a magnetometer unit 209. This system provides for independent adjustment of the orientations of the magnetic field generated by the Helmholtz coil pair 207, the orientation of object 112 and the position of the magnetometer unit 209. Only one of the conditions need be varied to generate a plurality of perturbation readings required for susceptibility tomography or mapping. For any orientation, unit 209 generates an array of perturbation signals representative of the local disturbance to the applied magnetic field B at a plurality of locations across the object. Magnet pair 207 is energized by a magnet power supply 211 and the magnetic position is controlled automatically by a magnetic position controller 213. Magnetometer electronics 217 are coupled to magnetometer unit 209 to control energization of unit 209 and generate perturbation signals representing the effects of on the magnetic field applied by coil pair 207 to the local susceptibility of object 112. Where required, the position of object 112 relative to magnets 207 and magnetometer 209 is controlled by a position control 219.

The entire system is controlled by a computer system 221 or similar arrangement. The computer system includes a master controller 223, that controls the operation of the magnet 207, magnetometer 209 and position controls 213, 217, and 219, and magnet power supply 211 and magnetometer electronics 215. Data acquisition electronics 225 processes the perturbation signals received from magnetometer electronics 215. This processing includes digitizing the analog perturbation signals for further processing by a susceptibility tomography algorithm 227. The appropriate algorithm generates the desired susceptibility map that is transmitted to an output and display device 229 (such as a video monitor, a plotter, a printer, .etc.).

Figure 2B:
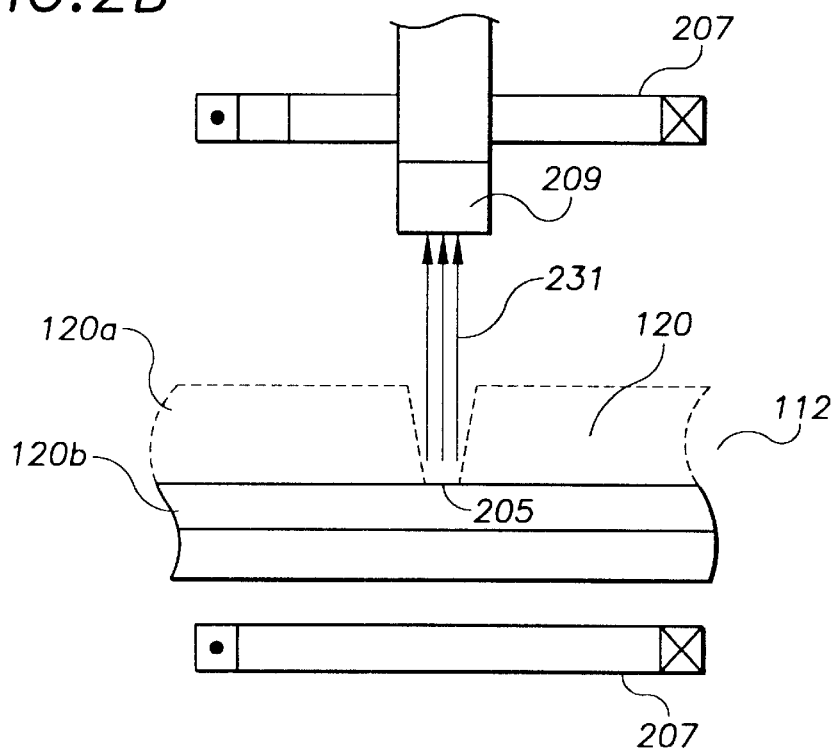

FIG. 2B shows an example system adapted to analyze a flip-chip die 112 for silicon substrate or circuit damage, according to an example embodiment of the present invention. The back side of the die 112 has been thinned from its original thickness designated by 120a to its reduced thickness 120b via global thinning. An examination region 205 is then selected; it may include, for instance, silicon or circuitry within the device. Coil pair 207, which are partially shown, are positioned above and below object 112 to help generate the magnetic field that is applied to object 112. Magnetometer 209 is positioned above region 205, within the field generated by coil pair 207, so that it can provide magnetic field measurements, in the form of perturbations 231, back to magnetometer electronics 215. As described earlier, this information is sent back to data acquisition electronics for eventual transcription into observable data. This is then compared to the data acquired on a similar object or device that is used as the reference or baseline profile for comparison to visualize the differences. Conditions such as the type of alloy damage, opaque spots, holes, contrast areas, degree of substrate damage, degree of damage to circuitry or to a device, or the like can be detected through the present invention.

Figure 3:
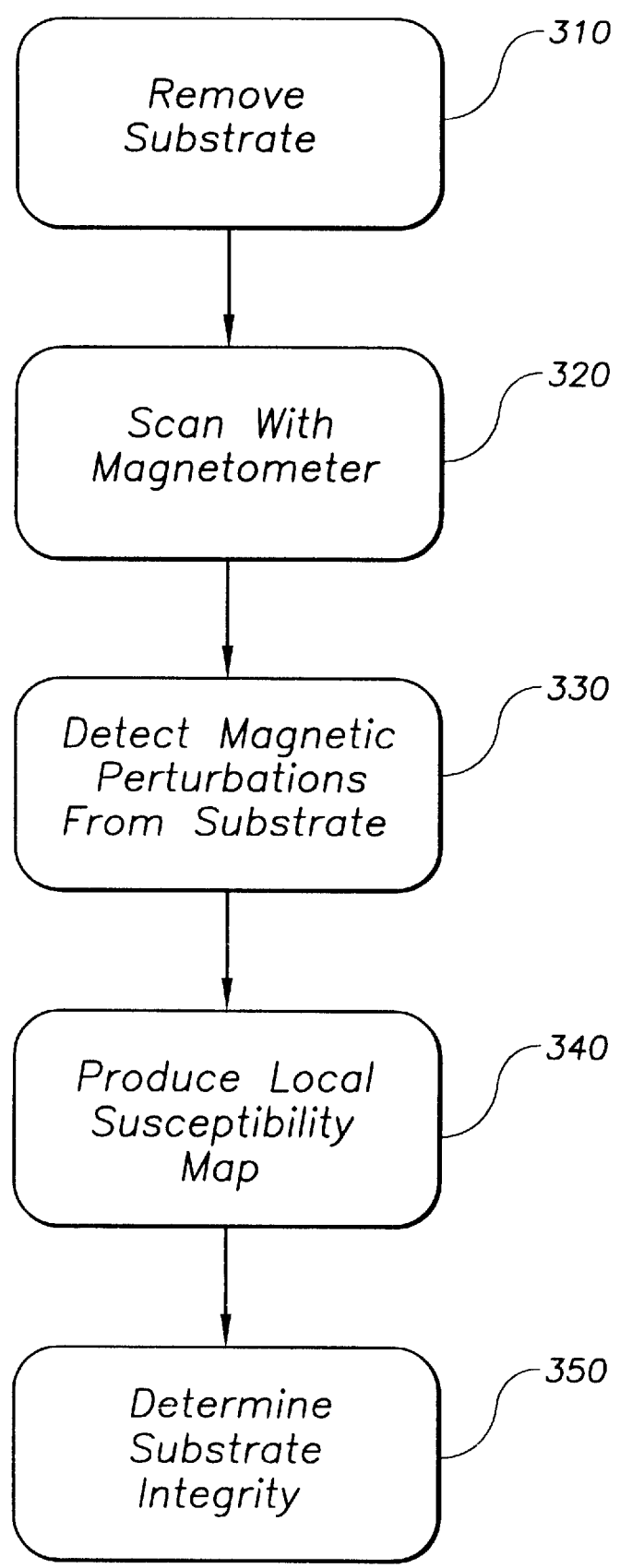
FIG. 3 is a flow diagram for a method for analyzing an integrated circuit, according to the present invention.

FIG. 3 is a flow diagram for a method of testing an integrated circuit die, according to a less-sophisticated example embodiment of the present invention. The flow begins at block 310 where substrate is removed and a region is selected. A magnetometer is used to scan the selected region at block 320 after a magnetic field has been set up around the substrate. At block 330, perturbations in the magnetic field coming from the substrate are picked up by the magnetometer. A local susceptibility map is produced from the perturbation signals that have been transcribed, as depicted at block 340. The integrity of the substrate is determined by visual comparison via the susceptibility map of the substrate versus the baseline substrate in the database, at block 350.

The present invention is amenable to various modifications and alternative forms that depart from the exact specifics shown by way of example in the drawings and the particular embodiments described above. The invention is to cover modifications, equivalents, and alternatives falling within the spirit and scope of the invention as defined by the appended claims.

What is claimed is:

1. A method for detecting substrate damage in a flip chip die having a back side and a circuit side, comprising:

thinning the back side of the die and selecting a region for examination;

applying in a magnetic field to the selected region;

scanning the region with a magnetic field detector and measuring a plurality of perturbations to generate an array of perturbation signals;

converting the perturbation signals to a local susceptibility map of the selected region of the die; and examining the susceptibility map of the selected region for substrate damage.

2. A method according to claim 1, wherein examining the susceptibility map for substrate damage includes comparing the magnetic susceptibility map with a reference map.

3. A method according to claim 2, wherein the die is in a flip chip package having the back side arranged opposite the circuit side.

4. A method according to claim 3, wherein the region includes the circuitry in the circuit side.

5. A method according to claim 1, wherein the magnetic field detector is a magnetometer.

6. A method according to claim 5, wherein examining the susceptibility map for substrate damage includes using the susceptibility map to determine a type of alloy damage.

7. A method according to claim 5, wherein measuring the plurality of perturbations includes electronically scanning an array of magnetometers placed adjacent the selected region of the die.

8. A method according to claim 6, wherein determining a type of alloy damage includes determining a pattern anomaly that includes at least one of the following from the group consisting of opaque spots, holes, and contrast areas.

9. A method according to claim 1, wherein examining the susceptibility map for substrate damage includes determining a degree of damage to silicon substrate.

10. A method according to claim 1, wherein the method further includes the step of quantifying a degree of damage to circuitry within the die.

11. A method according to claim 10, wherein quantifying the degree of damage includes determining a degree of damage to at least one device within the die.

12. A system for detecting substrate damage in a flip chip die having a back side and a circuit side, comprising:

thinning means for thinning the back side of the die and selecting a region for examination;

an irradiation coil for irradiating a radio frequency magnetic field on the die to be examined;

a detection coil, disposed in the vicinity of the die, for detecting perturbations in the magnetic field from the die;

a processor arrangement constructed to receive perturbations from the detection coil, convert to perturbations to perturbation signals and then digitize the signals; and a computer arrangement programmed to process the digitized perturbation signals via a susceptibility algorithm, produce a susceptibility map and examine the susceptibility map for substrate damage.

13. A system for detecting substrate damage in a flip chip die having a back side and a circuit side, comprising:

means for thinning the back side of the die and selecting a region for examination;

means for applying a magnetic field to a substrate;

means for scanning the selected region with a magnetic field detector and means for measuring perturbations that will generate an array of perturbation signals;

means for converting the perturbation signals to a local susceptibility map of the selected region of the die; and means for examining the susceptibility map for substrate damage.

14. The system according to claim 13, wherein the computer arrangement is further programmed to examine the susceptibility map for a type of alloy damage.

15. The system according to claim 13, wherein the computer arrangement is further programmed to examine the electron channeling pattern and determine therefrom a pattern anomaly that includes at least one of the following from the group consisting of: opaque spots, holes, and contrast areas.

16. A method for detecting substrate damage in a flip chip die having a back side and a circuit side, the flip chip die adapted to be disposed within a flip chip package having the back side arranged opposite the circuit side, the method comprising:

globally thinning the back side of the die and selecting a region for examination;

generating an array of perturbation signals at the selected region;

converting the perturbation signals to a local susceptibility map of the selected region of the die; and examining the susceptibility map of the selected region for substrate damage.

17. The method of claim 16, wherein the step of generating an array of perturbation signals includes the steps of:

applying a magnetic field to the selected region while the flip chip is in non-destructive testing, the non-destructive testing including analysis of active circuitry in the selected region; and scanning the region with a magnetic field detector and measuring a plurality of perturbations to generate an array of perturbation signals.

18. The method of claim 17, wherein the step of converting the perturbation signals to a susceptibility map includes the step of imaging the active circuitry of the selected region.

19. The method of claim 18, wherein the step of globally thinning does not include the step of locally thinning the back side of the die.

20. The method of claim 19, after the step of examining the susceptibility map further including the step quantifying the degree of damage to the flip chip using the susceptibility map.

* * * * *